United States Patent
Dietrich et al.

(10) Patent No.: US 7,224,625 B2
(45) Date of Patent: May 29, 2007

(54) METHOD AND CIRCUIT ARRANGEMENT FOR CONTROLLING WRITE ACCESS TO A SEMICONDUCTOR MEMORY

(75) Inventors: Stefan Dietrich, Türkenfeld (DE); Thomas Hein, München (DE); Peter Schroegmeier, München (DE); Christian Weis, Germering (DE)

(73) Assignee: Infineon Technologies AG, München (DE)

( * ) Notice: Subject to any disclaimer, the term of this patent is extended or adjusted under 35 U.S.C. 154(b) by 211 days.

(21) Appl. No.: 11/117,698

(22) Filed: Apr. 29, 2005

(65) Prior Publication Data
US 2005/0254307 A1 Nov. 17, 2005

(30) Foreign Application Priority Data
Apr. 30, 2004 (DE) ............ 10 2004 021 694

(51) Int. Cl.
*G11C 7/00* (2006.01)
(52) U.S. Cl. .......... 365/193; 365/233; 365/230.06
(58) Field of Classification Search ........ 365/193, 365/233, 230.06, 230.08, 189.01, 189.05
See application file for complete search history.

(56) References Cited

U.S. PATENT DOCUMENTS

| | | | |
|---|---|---|---|
| 6,466,507 B2 * | 10/2002 | Ryan | 365/230.01 |
| 6,504,790 B1 * | 1/2003 | Wolford | 365/233 |
| 6,987,700 B1 * | 1/2006 | Hong et al. | 365/194 |
| 7,117,292 B2 * | 10/2006 | Kelly | 711/5 |
| 2003/0151971 A1 | 8/2003 | Acharya et al. | |

* cited by examiner

*Primary Examiner*—Gene N Auduong
(74) *Attorney, Agent, or Firm*—Morrison & Foerster LLP

(57) ABSTRACT

The invention relates to a method for controlling write access to a semiconductor memory, particularly a DDR graphics memory, in which a multiplicity of data packets are written to the semiconductor memory per data burst, in which write access is initiated by a write command and the data packets which are to be written to the memory are latched under the control of a cycle of a data strobe write clock control signal, where the data packets are latched by alternately using a respective falling and rising edge of the data strobe write clock control signal, and where the data strobe write clock control signal has a defined state at the start of the write operation. The invention also relates to a circuit arrangement for carrying out the method.

18 Claims, 6 Drawing Sheets

METHOD AND CIRCUIT ARRANGEMENT FOR CONTROLLING WRITE ACCESS TO A SEMICONDUCTOR MEMORY

CLAIM FOR PRIORITY

This application claims priority to German Application No. 10 2004 021 694.0 filed Apr. 30, 2004, which is incorporated herein, in its entirety, by reference.

The invention relates to a method and a circuit arrangement for controlling write access to a semiconductor memory, particularly to a DDR graphics memory.

Although they may be applied to any semiconductor memories, the present invention and its underlying problems are explained below with reference to DDR semiconductor memories and, in this case, particularly graphics memories.

In modern computer and software applications, there is an increasing need to process ever greater volumes of data in ever shorter times. The data are stored using large-scale integrated memories, such as DRAM memories. Such semiconductor memories, in particular dynamic read/write memories such as a DRAM memory, are produced in different embodiments and variants, with the individual embodiments differing from one another essentially in their operating behavior.

To meet the requirement for ever greater speed which has just been mentioned for processing data, in the case of such a semiconductor memory these data need to be written to the memory and read from this memory again at an appropriate speed. This can be done, by way of example, at an ever increasing operating frequency which can be used to read and write the data from and to a semiconductor memory.

Another option is to use semiconductor memories designed specifically for high data rates. An example of such a semiconductor memory is the "DDR-DRAM" memory, where DDR stands for "Double Data Rate". Whereas, in conventional semiconductor memories, read and write operations are performed only upon the rising or upon the falling edge of a clock signal, data in the aforementioned DDR semiconductor memories are read from the semiconductor memory and written back to the memory both upon the rising and upon the falling edge of the clock signal. This semiconductor memory is thus distinguished by a double data rate.

A DDR semiconductor memory of this type is used in graphics applications, for example. In graphics applications, the large volume of data to be processed means that particularly high demands are placed on the power and hence the capability of reading the data to be processed from the memory and writing them back to the memory at as high a speed as possible.

Future third-generation graphics memories, that is to say graphics memories based on the new "GDDR-III" standard, have improved power over previous graphics memory generations, such as the GDDR-II standard. In this case, a significant improvement over previous graphics memories is the new definition of the "data strobe signal", or DQS signal for short. This new definition of the DQS signal now stipulates that the DQS signal must be at a defined logic level, for example at a high logic level (HIGH) in the inactive state (e.g. termination after VDD=1.8 volts). In addition, the DQS signal must change from a high logic level (HIGH) to a low logic level (LOW) in defined fashion at the start of a write access operation.

Figure 1:
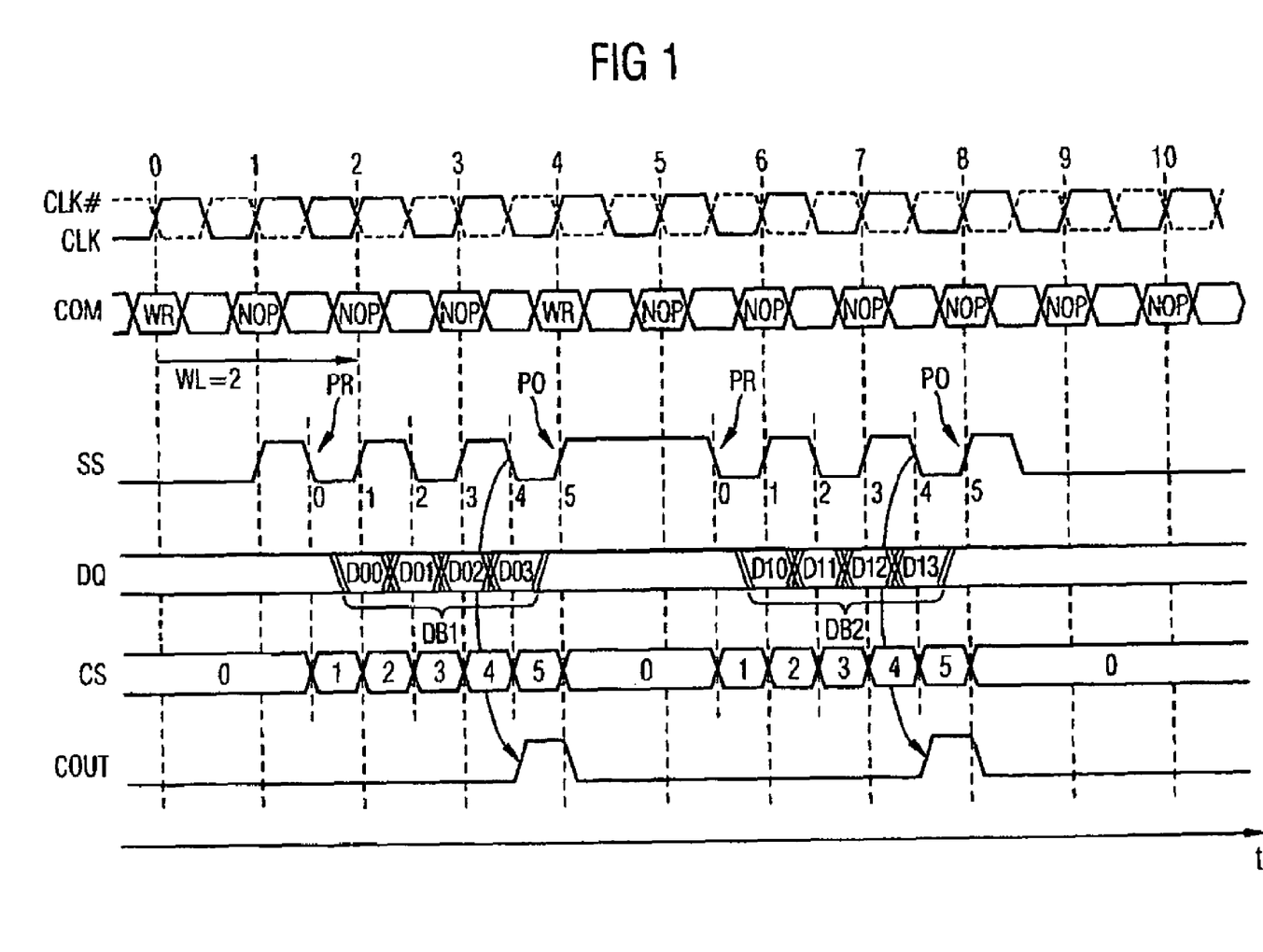
FIG. 1 shows a first sequence diagram to illustrate write access with a series of write commands.

According to the specification of the third-generation graphics memories, it is permissible to send series of write commands to the graphics memory. Adjacent write commands (WR command) may be at different distances from one another, however. To perform a correct write operation, however, there must be at least one "NOP (No Operation) command between two successive write commands. FIG. 1 shows a sequence diagram in which first of all a first write command WR and then a second write command WR are executed for a series comprising two write commands WR. In this case, WL denotes the generally programmable interval between write commands WR and data DQ sent by a program-controlled device. WL thus denotes the write latency.

In the case of a third-generation graphics memory, the burst length is stipulated as 4, that is to say that four data packets D00–D03, D10–D13 are processed in parallel within a data burst lasting two cycles of the clock signal CLK. After the end of a respective write command WR, the counter is respectively at the state "0".

The write access is controlled by the clock signal CLK or by a write control signal SS derived therefrom. Upon a first falling edge of the write control signal SS, the counter is started. This edge of the write control signal SS is also called the preamble PR. Upon every subsequent rising or falling edge of the write control signal SS, a respective data packet D00–D03 from a first data burst DB1 is latched, that is to say is written to the graphics memory. This means that for a counter state of "4" the last respective data packet D03 from the first data burst DB1 is latched. The subsequent rising edge of the write control signal SS, corresponding to the counter state "5", is also called the postamble PO. Upon the postamble PO, the counter thus switches from "5" to "0". Next, that is to say after the counter state "5", the counter state is reset back to "0". The counter state then remains at "0" until further write access is signaled by means of a second write command WR, in order to latch data packets D10–D13 from a subsequent second data burst DB2.

Figure 2:
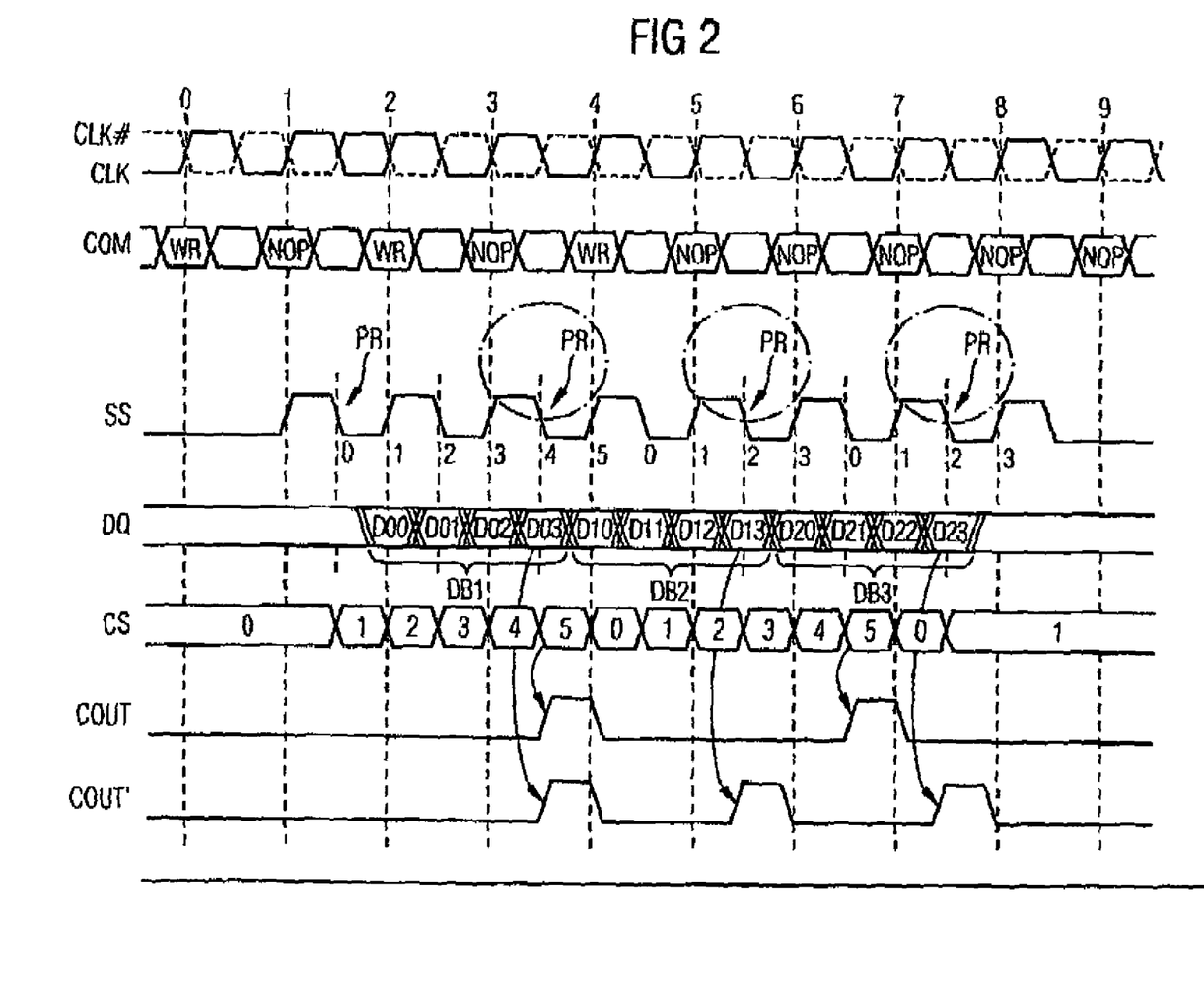
FIG. 2 shows a sequence diagram to illustrate a conflict for write access in the case of a series of write commands.

A critical case for the counter is obtained during write access, where just a single NOP command is respectively present between two successive write commands WR, that is to say for a command sequence WR, NOP, WR, NOP etc. Such a sequence of write commands WR with no more than one NOP command NOP arranged between them is also called a "gapless" write command below, since the data from two successive data bursts are meant to be written to the graphics memory more or less without interruption. FIG. 2 shows a sequence diagram to illustrate a conflict in the case of three such gapless write commands.

The primary problem here is that in the case of a gapless write command the last rising edge, that is to say the postamble PO, of the write control signal SS, which edge is associated with the last data packet D03 from the first data burst DB1, and the first falling edge, that is to say the preamble PR, of the write control signal SS, which edge is associated with the first data packet D10 from the subsequent second data burst DB2, respectively overlap. There is thus no longer any possibility of an explicit distinction between the data packets D00–D03, D10–D13 from two adjacent data bursts DB1, DB2.

The problem is revealed particularly for the counter or its counter state. In line with the counter state, the counter would in this case interpret the edge of the write control signal SS of the second data burst as preamble PR, although the preamble PR of this data burst was already present one clock cycle earlier. However, this would result in the counter output signal being present a whole clock cycle too late in the case of the second write access operation. Similarly, the counter output signal would accordingly be two clock cycles too late in the case of the third gapless write command, that is to say in the case of the third data burst DP3.

Particularly in the case of a large number of such successive gapless write commands WR, there is then inevitably an increasing shift in the counter output signal, with the result that the individual data packets Dx0–Dx3 in the various data bursts $DB_x$ are no longer able to be latched correctly and hence are no longer able to be written to the memory correctly.

A solution to this problem currently does not exist, since this problem has only arisen with the new standard relating to the graphics memories of the future third generation, for which series of write commands are permitted.

Against this background, the present invention is based on the object of allowing improved control when handling write commands. In addition, the conflict described above needs to be avoided as far as possible in the event of a plurality of successive gapless write access operations to a memory.

In line with the invention, at least one of these objects is achieved by a method having the features of patent claim 1 and by a circuit arrangement having the features of patent claim 12.

Accordingly, the invention provides:

a method for controlling write access to a semiconductor memory, particularly a DDR graphics memory, in which a multiplicity of data packets are written to the semiconductor memory per data burst, in which write access is initiated by a write command and the data packets which are to be written to the memory are latched under the control of a cycle of a data strobe write clock control signal, where the data packets are latched by alternately using a respective falling and rising edge of the data strobe write clock control signal, and where the data strobe write clock control signal has a defined state at the start of the write operation. (patent claim 1)

a circuit arrangement for carrying out a method according to one of the preceding claims, which is designed to control write access to a semiconductor memory, particularly to a DDR graphics memory, in which a multiplicity of data packets are written to the semiconductor memory per data burst, having a control/synchronization device whose input is connected to an input for the data strobe write clock control signal and for the write signal and which controls and/or synchronizes the write operation in the case of write access (patent claim 12)

The invention makes use of the fact that in future DDR semiconductor memories, such as as in the third-generation graphics memory, the data strobe write signal (or WDQS signal for short) is now defined such that no more "don't care" states are allowed. In addition, the WDQS signal needs to change from a high logic level (HIGH) to a low logic level (LOW) in defined fashion in the preamble area at the start of a write access operation.

In this case, the idea behind the invention is now to use the WDQS signal as a write control signal. This allows defined and synchronized data handling to be performed, with the respective DQS signal being used as time reference for all processing steps.

The insight on which the present invention is based is also that a conflict, as has been described in the introduction to the description of the present invention, exists only when there are "gapless write commands", that is to say where a plurality of write commands are sent to the memory without interruption. In the case of write commands which are at a greater distance from one another, there is no conflict and hence also no need for action.

The idea behind the present invention is now to detect such a "gapless state" between two successive write commands in the first place. When a gapless state is identified, a corresponding control signal is produced which signals that there is gapless write access.

In one refinement, the counter is additionally also modified such that when gapless write access is detected fewer clock cycles are counted by the modified counter than would need to be provided for this. The counter or its counter state is thus bridged to a certain extent.

A write command may be detected as follows: A "NOP command" is prescribed between two write commands in line with the specification for such a semiconductor memory.

To detect a write command, a circuit provided specifically for this purpose is implemented in the command decoder, which is associated with the semiconductor memory in question, said circuit producing an appropriate control signal in the event of gapless write access, that is to say when the sequence WR, NOP, WR, NOP, etc. is identified. This control signal is not reset again until the gapless write state has ended, that is to say when there is no further write command following a last decoded write command and the subsequent prescribed NOP command. In this case, the control signal indicating the gapless write state is reset.

In addition, the counter is modified such that one respective clock cycles fewer is counted if the control signal indicates gapless write access. This measure avoids any conflict in the event of a plurality of successive gapless write access operations. It is thus possible to latch the data and hence to write the data to the memory correctly without any problem.

The particular advantage of the present invention is that in the event of a plurality of gapless write commands these can also be written to the memory without interruption. The inventive method is therefore also distinguished by very high power in the case of write access, since even the occurrence of gapless write access operations does not require the incorporation of a delay, and hence a high write speed is ensured for writing data to the semiconductor memory.

In this case, the data are written to the memory directly without any separating signals or other separations. This requires only slight modification of the memory. This modification is designed such that the memory supports more or less two different modes of operation: A first mode of operation, in which there are no gapless write access operations and in which the counter increments its counter state in appropriate fashion for each falling or rising edge of the WDQS write clock control signal and resets its counter state again after the last falling or rising edge, allowing a subsequent write command to be executed; and a second mode of operation, in which gapless write access operations take place. In the case of these gapless write access operations, the counter is slightly modified in order to take account of the problem that the last falling edge of a respective write access operation denotes the first falling edge of the subsequent write access operation, as it were. This modification is made very elegantly by virtue of the counter state being more or less bridged. In this way, the respective edges of the WDQS write clock control signal which have already been counted for the previous data packet are not recounted for the subsequent data packet. The counter state thus reflects the respective exact counter state in the case of such gapless write access operations too, which makes correct latching of the data possible in the first place.

Advantageous refinements and developments of the invention can be found in the other subclaims and in the description with reference to the drawings.

In one advantageous refinement, the data strobe write clock control signal has a firmly defined first logic level in the inactive state. In addition, the data strobe write clock control signal changes from a firmly defined second logic level (for example "1") to the first logic level (for example "0") at a prescribable time, for example when there is a change in the system clock's clock signal, at the start of a write operation.

In one advantageous refinement, after a respective write command the counter state of a counter is incremented or else alternatively decremented, starting at a first starting value, upon every cycle of the data strobe write clock control signal. Incrementing or decrementing is typically performed with a step size of one. At the end of a write operation associated with the respective write command the counter state is reset again, for example to zero or to another value, when a final value is reached.

In a further advantageous refinement, the data strobe write clock control signal is also used to synchronize the various counters.

In one advantageous refinement, there are at least two successive, gapless write commands. Such write commands are at a minimal distance from one another, the minimal distance being determined by the length of a data burst associated with a respective write command.

In one advantageous refinement, in a first mode of operation the counter state is reset to a first starting value if two successive write commands are at a distance from one another which is greater than the minimal distance. In a second mode of operation the counter state is reset to a second starting value, which has a greater magnitude than the first starting value, if gapless write commands are provided which are thus at the minimal distance from one another.

In one advantageous refinement, the write command and the duration of two successive write commands are used to derive a control signal which stipulates whether a write operation corresponding to a write command is performed in the first mode of operation or in the second mode of operation. Typically, the duration is determined by counting the falling and/or rising edges of the data strobe write clock control signal.

Typically, but not necessarily, the second starting value is set on the basis of the length of a data burst and/or on the basis of the cycle of the data strobe write clock control signal and/or on the basis of the first starting value.

In one advantageous refinement, the length of a data burst is four, that is to say that within a data burst four data packets per write command are latched, the first starting value being 0 and the second starting value being 2, and the final value at which the counter is reset being 5.

In one advantageous refinement, an adjustable delay is provided for the counter, which delay sets the starting value of the counter to the second starting value in the case of the second mode of operation, the delay being set by means of a delay control signal.

In one advantageous refinement of the inventive control/synchronization device, this device has a write synchronization counter whose output produces an enable signal on the basis of the data strobe write clock control signal and the write signal, said enable signal producing a write control signal for controlling the write operation in the presence of a counter enable signal.

In a further advantageous refinement, the data packets are latched by providing a shift register whose data input is connected to an input connection for inputting the data packets from a data burst, whose data output is connected to the semiconductor memory for shifting the latched data packets into the semiconductor memory, and whose control side is connected to a control connection for inputting the write control signal.

In one likewise advantageous refinement, a counting device is provided which uses the duration of two successive write commands to derive a control signal which stipulates whether a write operation takes place in the first mode of operation or in the second mode of operation.

In one advantageous refinement, the counting device has a first adjustable counter for setting a delay, the delay being able to be set using a delay control signal.

In one advantageous refinement, a second counter is provided which, to change its counter state, has a bridging device which can be actuated by the control signal, the counter being able to be operated in the first mode of operation or in the second mode of operation depending on the actuation of the bridging device by the control signal.

Typically, but not necessarily, at least one of the counters is in the form of a ring counter.

The invention is explained in more detail below using the exemplary embodiments which are indicated in the schematic figures of the drawing, in which.

In the figures of the drawing, elements, features and signals which are the same or have the same function have been provided with the same reference symbols—unless stated otherwise.

Figure 3:
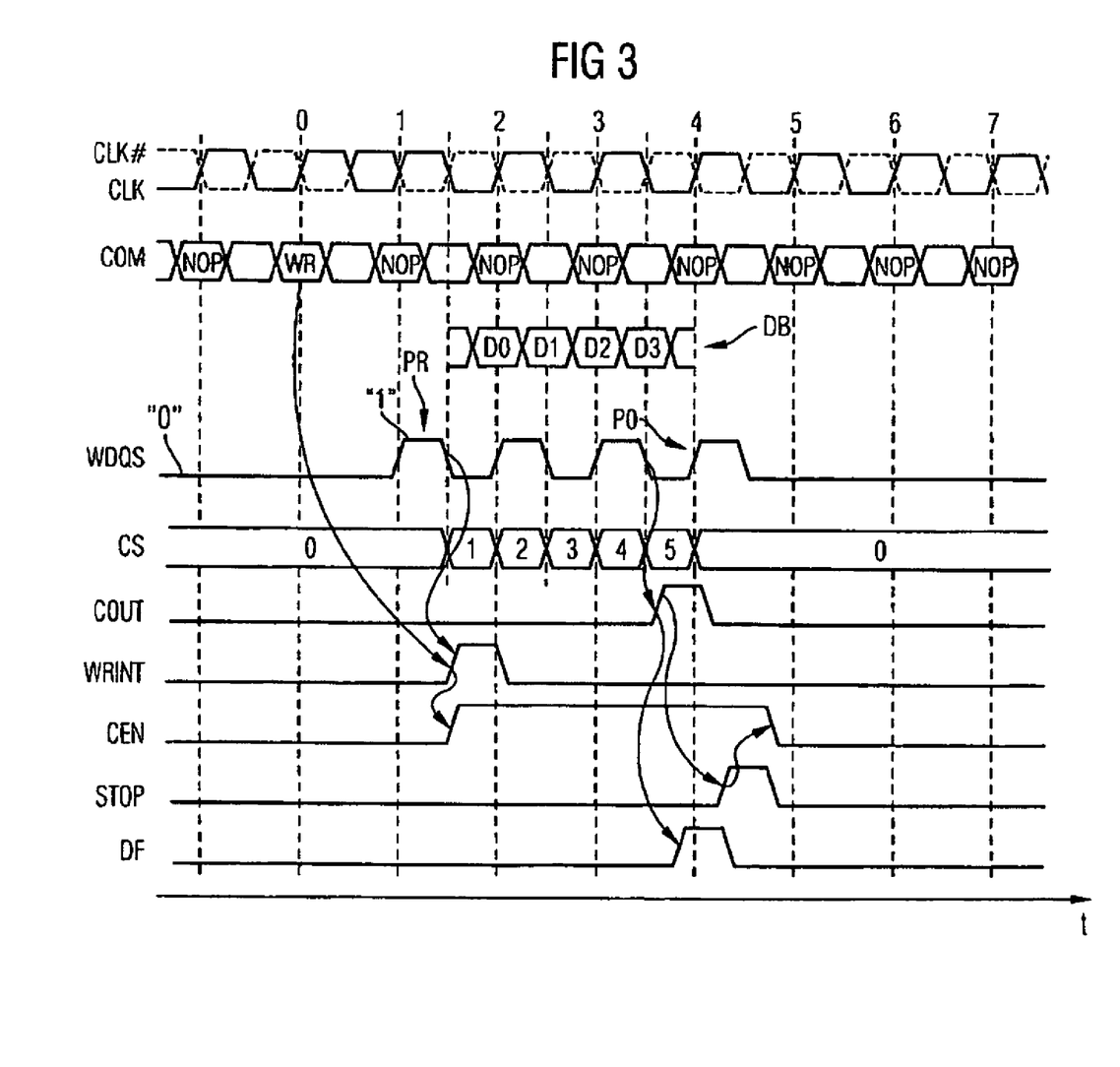
FIG. 3 shows a detailed sequence diagram to illustrate write access under the inventive control of the WDQS write clock control signal.

In FIG. 3, CLK denotes the clock signal and CLK# denotes the clock signal which is the inverse thereof.

The line denoted by COM contains the respective write commands WR, the specification making provision for at least one respective clock cycle with a "No Operation" command (or NOP command for short) to be arranged between two write commands WR. The write clock control signal WDQS is an externally generated data strobe control signal or DQS signal. In line with the invention, this write clock control signal WDQS is used to control a write command WR—as described in more detail below. In addition, a counter state signal CS, a counter output signal COUT, an internal write signal WRINT, a counter enable signal CEN, a stop command STOP and a data enable signal DF are provided.

The areas of the respective command line COM which are shaded gray denote "Don't Care" states, that is to say where there is an undefined state, but one which does not need to be taken into account.

The sequence diagram in FIG. 3 will be explained briefly below for a write access operation:

First of all, a write command WR is identified and the internal write signal WRINT is produced. In the present example, the write clock control signal WDQS is set to a logic high level in the next clock cycle, that is to say one clock cycle after the occurrence of the write command WR, for a respective half-cycle, which signals the start of a further write access operation for a subsequent data burst DB. In this case, WL=1. This state, in which the write clock control signal WDQS is set to a high logic level from a low logic level for the duration of one half-cycle of the clock signal CLK in defined fashion at the start of a write access operation and is then set back to a low logic level in defined fashion, is also called the preamble PR.

Upon the next falling edge of the write clock control signal WDQS within the preamble area PR, a counter is activated. In this case, the counter enable signal CEN is set to a high logic level. The counter now counts continuously upward (or alternatively also downward), with the counter state being incremented (or alternatively decremented) by one by a respective falling or rising edge of the write clock control signal WDQS. After the fourth edge of the write clock control signal WDQS within the data burst DB, that is to say after the third falling edge of the write clock control signal WDQS, including the edge of the preamble PR, the data enable signal DF is produced. Using this data enable signal DF, the data which have just been latched, that is to say read in, are shifted by a shift register 15 (latch) in parallel in the direction of the memory array 16 of the semiconductor memory. The next rising edge of the write clock control signal WDQS produces a stop signal STOP, which deactivates the counter 14 again. The counter enable signal CEN is set back to a low logic level, and the counter or its counter state is reset to "0" by means of the counter output signal COUT.

The particular advantage of third-generation graphics memories is that the preamble PR is stipulated in defined fashion at the start of a write access operation, that is to say that there are no undefined states of the write clock control signal WDQS, as was the case with previous graphics memories. This makes it possible to use the WDQS signal as a write clock control signal for the first time.

The particular advantage is now that the write control for writing data to the memory array 16 of the graphics memory can now be performed only with this write clock control signal WDQS. In this case, the edges of the externally provided write clock control signal WDQS are counted by a write synchronization counter 14 provided specifically for this purpose, which may be in the form of a ring counter 14, for example. The write synchronization counter 14 thus counts all identified edges of the write clock control signal WDQS between the preamble PR and the postamble PO. Upon that edge of the write clock control signal which corresponds to the last data packet D3 in the data signal DQ which is to be written to the memory, the counter output signal COUT is set to a high logic level. An enable signal DF derived from the counter state signal CS is used for the chip-internal data transfer. However, the data enable signal DF is not produced until firstly an internal write signal WR has been identified and secondly the counter output signal COUT has been set to a high logic level.

Figure 4:
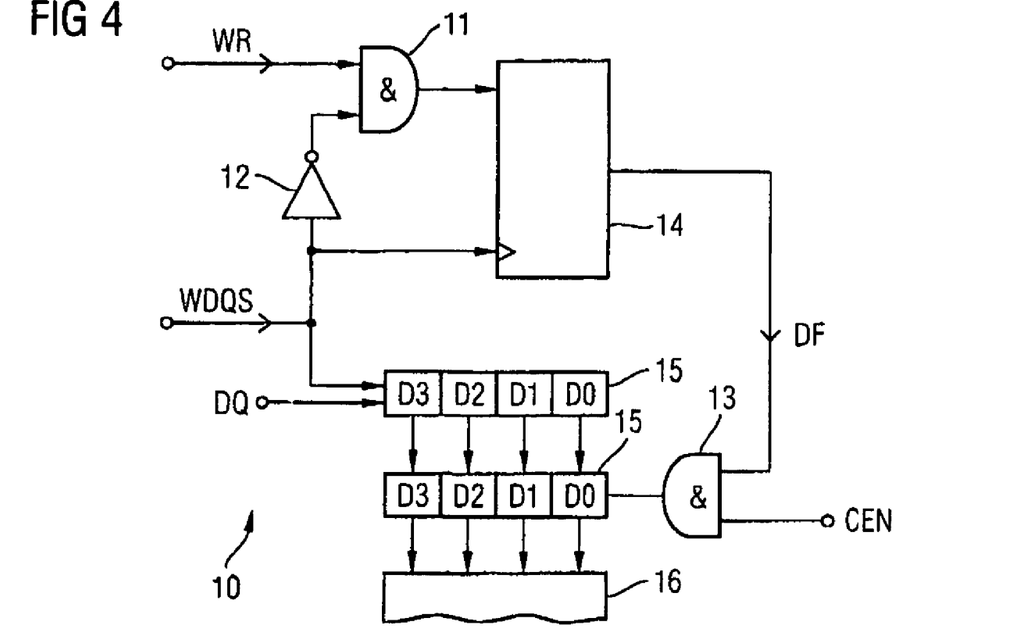
FIG. 4 shows a block diagram for the implementation of a write synchronization counter controlled using the WDQS write clock control signal from FIG. 3.

FIG. 4 shows a block diagram for implementing such a write synchronization counter controlled by means of the WDQS write clock control signal from FIG. 3.

The circuit arrangement in question is denoted by reference symbol 10 in FIG. 4. The input of the write synchronization counter denoted by reference symbol 14 is supplied with a write command WR and, via an inverter 12, with the write clock control signal WDQS, which are logically combined with one another in an AND gate 11. The output of the write synchronization counter 14 produces the enable signal DF, which is logically combined with the counter enable signal CEN in an AND gate 13, with the product controlling the operation of the shift register 15.

Upon write access to a DDR semiconductor memory, serial-to-parallel conversion of the data DQ which are read in needs to be performed on the input stage of the DDR semiconductor memory. This is necessary because two respective data packets are delivered per clock cycle CLK, but internal operation in the DDR semiconductor memory continues at single data rate. This process is called a "prefetch process" in the specification for a DDR semiconductor memory. To identify the end of a parallelization process, it is necessary to count the number of incoming data packets D0, D1, D2, D3 in suitable form. An example of the sequence in this case is as follows:

First, a data burst DB containing the data packets D0, D1, D2, D3 is loaded into the shift register 15, which is clocked using the write clock control signal WDQS. Next, all four data packets D0, D1, D2, D3 are written from the shift register 15 to the interior of the DDR semiconductor memory, that is to say to the latter's memory array 16. To control and, in particular to synchronize this sequence, the write synchronization counter 14 is provided. In the present exemplary embodiment, the write synchronization counter 14 is in the form of a ring counter. The write synchronization counter 14 needs to have the following prerequisites:

First, the write synchronization counter 14 requires a defined starting point and a defined ending point. In addition, the write synchronization counter 14 also needs to be clocked using a defined clock signal. In the case of a DDR semiconductor memory, the data DQ are delivered in sync with the write clock control signal WDQS as a clock signal. This write clock control signal WDQS is now used as a counter pulse, since in line with the specification for a DDR semiconductor memory a change of edge takes place in the WDQS write clock control signal with every data packet D0, D1, D2, D3. At the start of the preamble PR of the write clock control signal WDQS, which is intended to initiate a write command, this WDQS write clock control signal must change from a high logic level to a low logic level in defined fashion. For this reason, the falling edge of the write clock control signal WDQS can be used as start signal for an edge-triggered write synchronization counter 14 within the preamble area PR. However, this means that all signals in the write synchronization counter 14 come from the same clock domain, that is to say from the write clock control signal WDQS, as it were. All of the drawbacks which would arise when the start signal is generated from another signal or clock advantageously disappear in this case.

Figure 5:
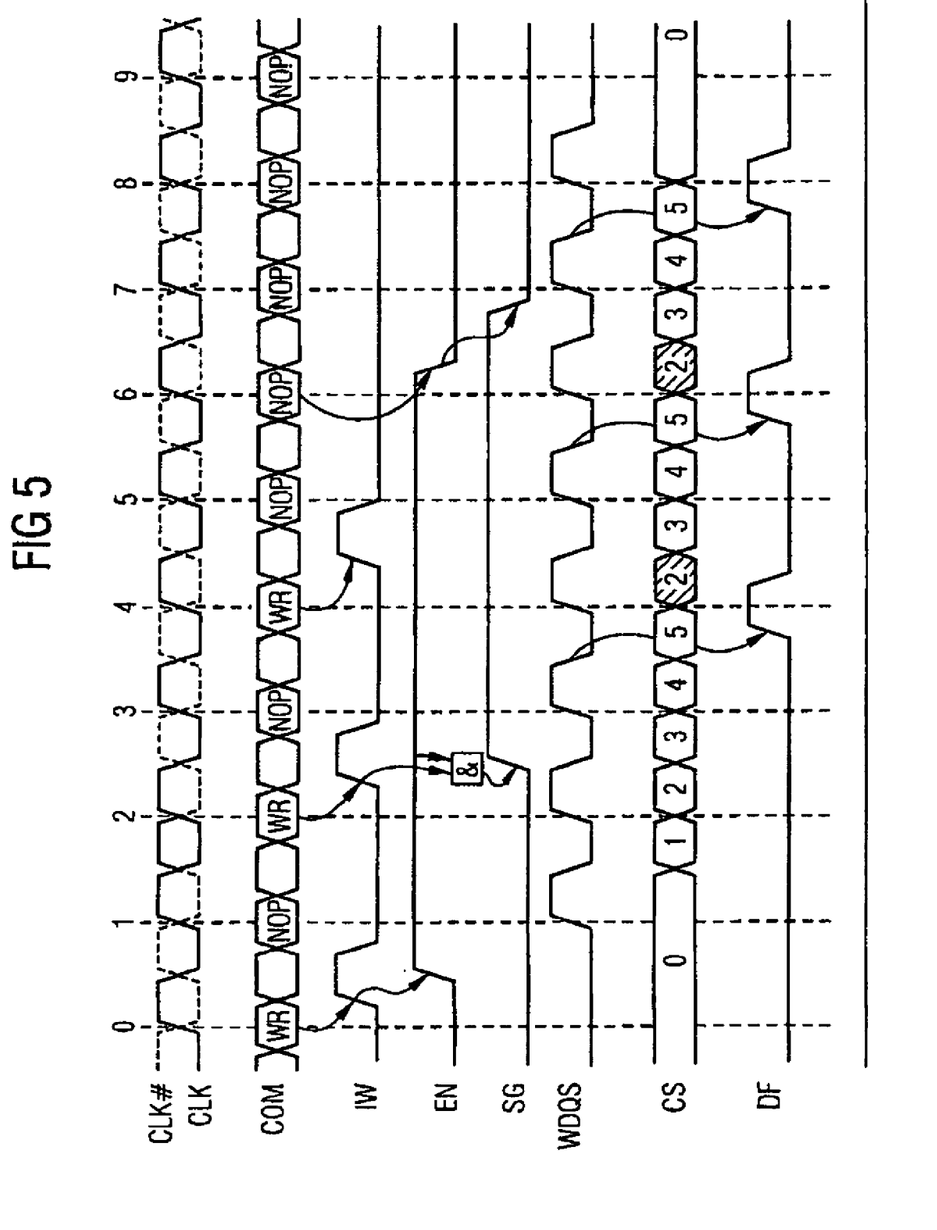
FIG. 5 shows a detailed sequence diagram to illustrate the inventive method, which avoids any conflict in the case of gapless write commands.

FIG. 5 shows a detailed sequence diagram to illustrate the inventive method, where conflicts in the case of gapless write commands are avoided.

FIG. 5 shows three "gapless write commands" WR, that is to say that in this case there would be a conflict on account of the command sequence WR, NOP, WR, NOP, WR without further measures. In line with the invention, a "gapless control signal" SG is produced in this case which eliminates this conflict and thus allows correct data transfer to the memory.

To obtain this gapless control signal SG, an internal write control signal IW is first produced after a write signal WR. This internal write control signal IW is set to a high logic level directly after the write command WR for the duration of a half-cycle of the clock signal CLK and is then set back to a low logic level. On account of this internal write control signal IW, an enable signal EN, which was previously at a low logic level, is set to a high logic level. The enable signal EN remains at a high logic level at least for the duration of a data burst DB, that is to say for the duration of two complete cycles of the clock signal CLK or of the write clock control signal WDQS. If a second write command WR is now produced after two cycles of the write clock control signal WDQS, the internal write control signal IW is then set back to a high logic level. At this time, the enable signal EN and the internal write control signal IW are thus at a logic high level, which means that the gapless control signal SG is set to a high logic level. This write control signal IW now remains at this high logic level at least for the duration of a data burst DB, and signals that the second write command WR is a gapless write command. As a result, after the third falling edge of the write clock control signal WDQS, that is to say when the counter state changes from "4" to "5" upon the next rising edge of the write clock control signal WDQD, the counter state is reset not from "5" to "0" but rather from "5" to "2". The counter thus counts from "2" to the counter state "5" upon the next data burst DB, instead of from "0" to "5", as is the case with a non-gapless write command.

The counter continues to be reset to "2" instead of "0" until the gapless control signal SG is at a high logic level, and hence the signal is given that the current write command WR is a gapless write command.

Figure 6:
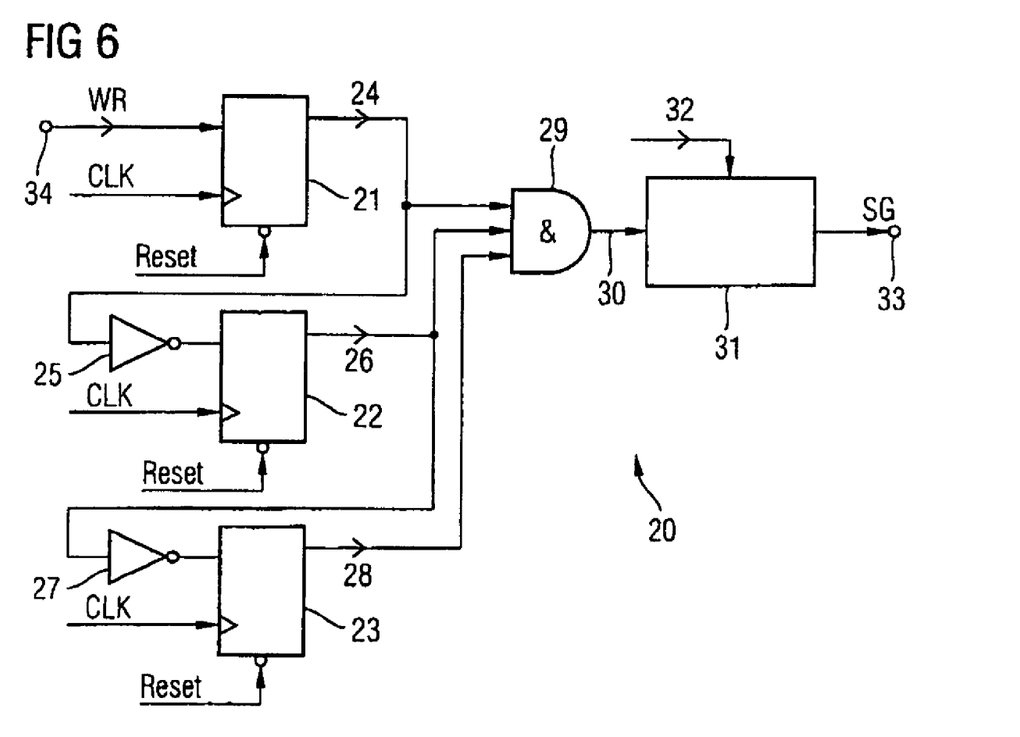
FIG. 6 shows a block diagram of an inventive circuit arrangement for producing a gapless control signal for avoiding any conflict in the case of a plurality of gapless write commands.

FIG. 6 shows a block diagram of an inventive circuit arrangement for producing a gapless control signal to avoid conflict in the event of a plurality of gapless write commands.

The circuit arrangement denoted by reference symbol 20 contains three flipflops 21, 22, 23 whose inputs and outputs are arranged in succession. A respective flip-flop 21, 22, 23 has a clock input into which clock signal CLK (or alternatively the inverse clock signal CLK#) is input. In addition, each flipflop 21, 22, 23 has a Reset input, which can be used to input a Reset signal and which can thus be used to reset the respective flip-flop 21, 22, 23 to a defined value.

In addition, each flipflop 21, 22, 23 has a data input. The data input of the first flipflop 21 is used to input the write signal WR. The output of the first flipflop 21 produces a first signal 24 which is input into the data input of the second flipflop 22 via an inverter 25. The output of the second flipflop 22 produces a second signal 26, which is input into the data input of the third flipflop 23 via an inverter 27. The output of the third flipflop 23 produces a third signal 28. The flipflops 21, 22, 23 thus form a shift register.

In the case of a command sequence WR, NOP, WR which is input into the first flipflop 21 in succession via the input 34 of the circuit arrangement 20, the data outputs of the three flipflops 21, 22, 23 thus each produce signals 24, 26, 28 which are at a logic high level. The data outputs of the three flipflops 21, 22, 23 have a downstream AND gate 29, to which the three signals 24, 26, 28 are thus supplied. In this case, that is to say in the case of a command sequence WR, NOP, WR and hence a high logic level for the signals 24, 26, 28, the output of the AND gate 29 produces a signal 30 which is likewise at a high logic level. This signal 30 can be used as a gapless control signal SG straightaway.

However, it is particularly advantageous if this control signal 30 is first input into a delay device 31. The delay device is used to shift the gapless control signal SG by the duration or length WL so that it matches the incoming data and the write clock control signal WDQS. Depending on the setting of this delay circuit 31, it is thus possible to stipulate how far the counter and hence its counter state are bridged and thus restart the counter state at which the counter starts when it is reset. This counter state or this bridging can be set using a delay control signal 32. At the output of the delay device 31, it is then possible to tap off the gapless control signal SG.

This delay which can be set using the delay control signal 32 is essentially dependent on the number of data packets D0, D1, D2, D3 in a data burst DB. In the case of a third-generation DDR semiconductor memory, a data burst DB respectively comprises a total of four data packets D0, D1, D2, D3. This means that the counter is reset from a counter state "5" to a counter state "2" instead of the counter state "0" in the event of a positive control signal 30 which is at a high logic level.

Figure 7:
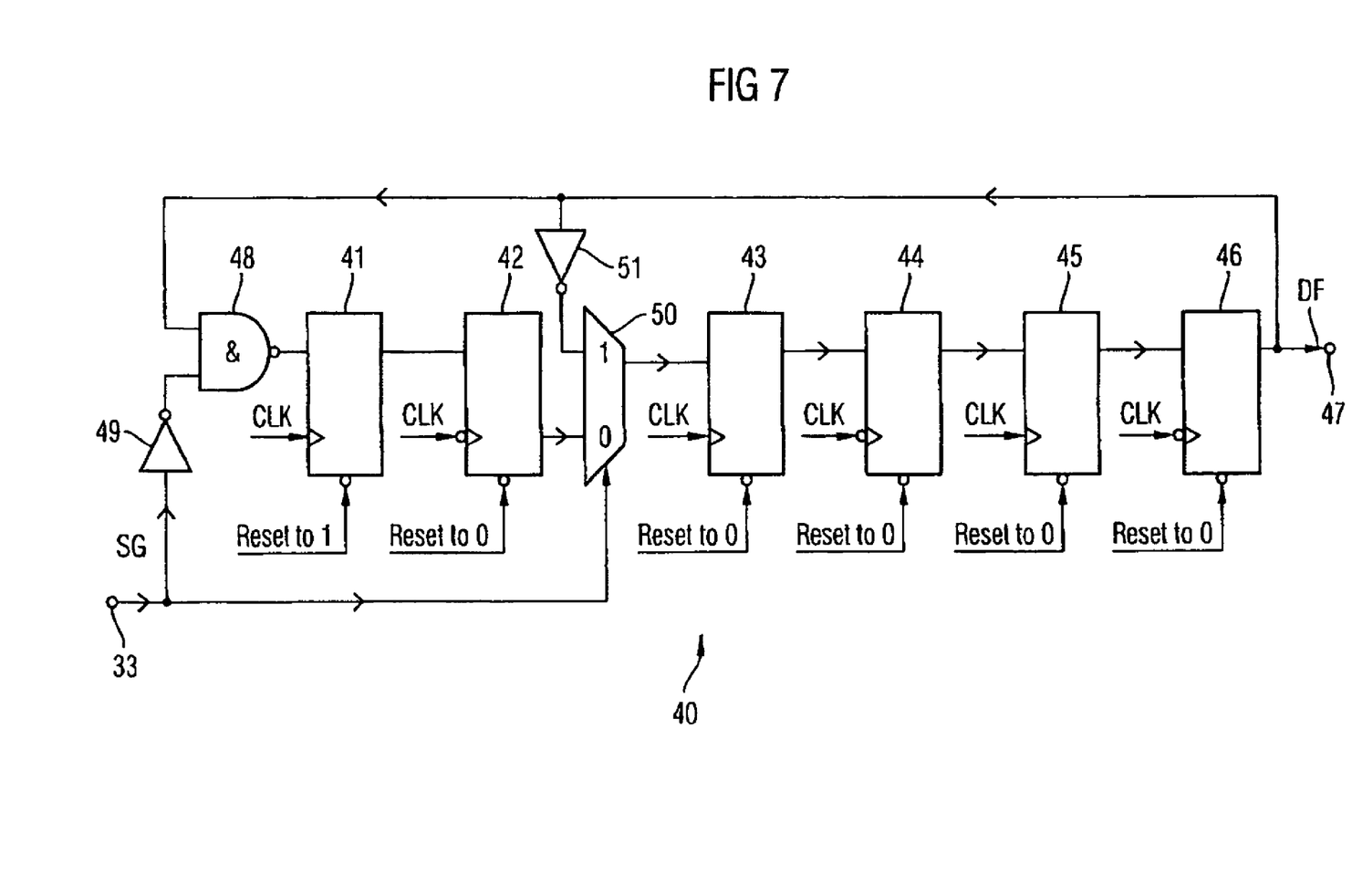
FIG. 7 shows a block diagram of an inventively modified ring counter which is controlled by a gapless control signal.

FIG. 7 shows a block diagram of an inventively modified ring counter which is controlled by a gapless control signal.

In FIG. 7, the inventive counter is denoted by reference symbol 40. In the present exemplary embodiment, the inventive counter 40 is in the form of a ring counter. The counter 40 has six flipflops 41–46 in a manner which is known per se. The flipflops 41–46 each have a Reset input for resetting the flipflops 41–46 using appropriate Reset signals. In addition there is a clock input which can be used to input a clock signal CLK into a respective flipflop 41–46. The output of a respective flipflop 41–46 is respectively coupled to the data input of the downstream flipflop. The output of the last flipflop 46 forms the output 47 of the counter 40, as it were. In addition, the output of the last flipflop 46 is also coupled to the data input of the first flipflop 41.

In line with the invention, the counter 40 now has a bridging device 33, 48–51. The bridging device 33, 48–51 contains a NAND gate 48, which is connected upstream of the data input of the first flipflop 41. The input of this NAND gate 48 is connected to the output 47 of the counter 40, on the one hand, and to the control input 33 via an inverter 49. The control input 33 can be used to input the gapless control signal SG. In addition, the bridging device 33, 48–51 contains a multiplexer 50 which is arranged between the second and third flip-flops 42, 43. The input of the multiplexer is thus connected to the second flipflop 42 and, via an inverter 51, to the output 47 of the counter 40. The control input of the multiplexer 50 is connected to the control input 33.

The way in which the inventively modified counter 40 works is described briefly below.

In the case where no gapless write commands are applied, the counter 40 acts as a conventional six-stage counter, in which the six flipflops 41–46 arranged in series with one another count upward (or else downward), when triggered by the clock signal CLK, per clock signal starting from "0". In this case, the gapless control signal SG is at a low logic level, which means that a respective logic 1 is applied to the two inputs of the NAND gate 48.

If the gapless control signal SG is at a high logic level, on the other hand, that is to say when gapless write commands are applied, then a logic 0 is always applied to the input of the first flipflop 41. In addition, the gapless control signal SG is used to actuate the multiplexer 50 such that the counter 40 is bridged and hence the data input of the third flipflop 43 is connected to the data output 47. It is thus a very simple matter to bridge the counter 40.

In line with the invention, the counter 40 is thus modified such that, after a complete cycle, the multiplexer 50 is used to produce not the change in the counter state from "5" to "0" but rather from "5" to "2" if the gapless control signal SG is at a high logic level and thus signals that a gapless write command is present. This advantageously avoids any conflict, as described at the outset.

In the present exemplary embodiment, it is assumed that the counter state is cut off from the input of the counter 40, that is to say that in the present case the first two flipflops 41, 42 are bridged. It would naturally be conceivable for the bridge to be at any location in the counter 40, even though a bridge at the input is easier to implement in terms of circuitry, since in this case the output signal DF from the counter 40 can advantageously be used concurrently, as it were.

Although the present invention has been explained in more detail above with reference to a preferred exemplary embodiment, it is not limited thereto but rather can be modified in a variety of ways.

In particular, the inventively modified counter and the inventive circuit arrangement for producing a control signal to actuate a counter are deliberately of very simple design. It goes without saying that these circuit arrangements may be of any other design without departing from the basic principle of the present invention. In particular, the counter may have any number of flip-flops, depending on the application and in particular depending on the command structure. In addition, the bridging circuit may also be arranged at any location within the counter or may be of any other design. The same applies to the inventive circuit for producing the control signal itself.

In principle, the functionality of these circuits can naturally also be provided by a program-controlled device, for example by a microprocessor or a microcontroller, or else by a programmable logic circuit, for example a PLD or FPGA circuit. However, the refinement described with reference to FIGS. 6 and 7 is particularly advantageous, especially for reasons of circuitry and for reasons of power, and is therefore preferable.

The invention has also been described by way of example using a DDR semiconductor memory in the form of a graphics memory. However, the invention can also be used advantageously for any semiconductor memories which have a DQS write control signal with a defined preamble and postamble.

In addition, it is not necessary to have "prefetch 4 write access", in which four respective data packets are written to the memory for each data burst and hence upon each write access operation. Other prefetch write access operations, in which fewer or else more data packets are processed per write access operation, would also be conceivable.

LIST OF REFERENCE SYMBOLS

10 Circuit arrangement
11 AND gate
12 Inverter
13 AND gate
14 Ring counter
15 Shift register
16 Memory array
20 Circuit arrangement
21–23 Flip-flops
24 Write signal
25 Inverter
26 Write signal
27 Inverter
28 Write signal
29 AND gate
30 Control signal
31 Delay device, counter
31 Delay control signal
33 Control signal
34 Output, control input
40 Modified, bridgeable counter
41–46 Flipflops
47 Output of the counter
48 NAND gate
49 Inverter
50 Multiplexer
51 Inverter
CEN Counter enable signal
CLK Clock signal
CLK# Inverse clock signal
COM Command line
COUT Counter output signal
CS Counter state signal
D0–D3 Data packets in a data burst
D00–D03 Data packets in the first data burst
D10–D13 Data packets in the second data burst
DB, DB1–DB3 Data bursts
DF Enable signal
DQ Data signal
EN Enable signal
IW Internal write control signal
NOP NOP command, No Operation command
PO Postamble (area)
PR Preamble (area)
Reset Reset signal
SG Control signal
SS Write control signal
STOP Stop signal
WDQS Write clock control signal, write data strobe signal
WR Write command
WRINT Internal write signal

The invention claimed is:

1. Method for controlling write access to a semiconductor memory, particularly a DDR graphics memory, in which a multiplicity of data packets (D0–D3) are written to the semiconductor memory per data burst (DB), in which write access is initiated by a write command (WR) and the data packets (D0–D3) which are to be written to the memory are latched under the control of a cycle of a data strobe write clock control signal (WDQS), where the data packets (D0–D3) are latched by alternately using a respective falling and rising edge of the data strobe write clock control signal (WDQS), and where the data strobe write clock control signal (WDQS) has a defined state at the start of the write operation.

2. Method according to claim 1,
characterized
in that the data strobe write clock control signal (WDQS) has a firmly defined first logic level ("1") in the inactive state, and in that the data strobe write clock control signal (WDQS) changes from a firmly defined second logic level ("1") to the first logic level ("0") at a prescribable time at the start of a write operation.

3. Method according to claim 1, characterized in that after a respective write command (WR) the counter state of a counter is incremented or decremented, starting at a starting value, upon every cycle of the data strobe write clock control signal (WDQS), and in that at the end of a write operation associated with the respective write command (WR) the counter state is reset to the starting value or to another starting value when a final value is reached.

4. Method according to claim 1, characterized in that the data strobe write clock control signal (WDQS) is used to synchronize the counters.

5. Method according to claim 1, characterized in that at least two successive gapless write commands (WR) are provided which are at a minimal distance from one another, the minimal distance being determined by the length of a data burst (DB) associated with a respective write command (WR).

6. Method according to claim 5, characterized in that in a first mode of operation the counter state is reset to a first starting value ("0") if two successive write commands are at a distance from one another which is greater than the minimal distance, and in that in a second mode of operation the counter state is reset to a second starting value ("2"), which has a greater magnitude than the first starting value ("0"), if gapless write commands (WR) are provided which are at a minimal distance from one another.

7. Method according to claim 1, characterized in that the write command (WR) and the duration of two successive write commands (WR) are used to derive a control signal (SG) which stipulates whether a write operation corresponding to a write command (WR) is performed in the first mode of operation or in the second mode of operation.

8. Method according to claim 7, characterized in that the duration is determined by counting the falling and/or rising edges of the data strobe write clock control signal (WDQS).

9. Method according to claim 6, characterized in that the second starting value ("2") is set on the basis of the length of a data burst (DB) and/or on the basis of the cycle of the data strobe write clock control signal (WDQS) and/or on the basis of the first starting value ("0").

10. Method according to claim 6, characterized in that the length of the data burst (DB) is four, and in that within the data burst (DB) four data packets (D0–D3) per write command (WR) are latched, the first starting value being 0 and the second starting value being 2, and the final value at which the counter is reset being 5.

11. Method according to claim 6, characterized in that an adjustable delay is provided for the counter, which delay sets the starting value of the counter to the second starting value ("2") in the case of the second mode of operation.

12. Circuit arrangement for carrying out a method according to claim 1, which is designed to control write access to a semiconductor memory, particularly to a DDR graphics memory, in which a multiplicity of data packets (D0–D3) are written to the semiconductor memory per data burst (DB), having a control/synchronization device (10) whose input is connected to an input for the data strobe write clock control signal (WDQS) and for the write signal (WR) and which controls and/or synchronizes the write operation in the case of write access.

13. Circuit arrangement according to claim 12, characterized in that the control/synchronization device (10) has a write synchronization counter (14) whose output produces an enable signal (DF) on the basis of the data strobe write clock control signal (WDQS) and the write signal (WR), said enable signal producing a write control signal for controlling the write operation in the presence of a counter enable signal (CEN).

14. Circuit arrangement according to claim 12, characterized in that the data packets (D0–D3) are latched by providing a shift register (15) whose data input is connected to an input connection for inputting the data packets (D0–D3) from a data burst (DB), whose data output is connected to the semiconductor memory (16) for shifting the latched data packets (D0–D3) into the semiconductor memory (16), and whose control side is connected to a control connection for inputting the write control signal.

15. Circuit arrangement according to claim 12, characterized in that a counting device (20) is provided which uses the duration of two successive write commands (WR) to derive a control signal (SG) which stipulates whether a write operation takes place in the first mode of operation or in the second mode of operation.

16. Circuit arrangement according to claim 15, characterized in that the counting device (20) has a first adjustable counter (31) for setting a delay, the delay being able to be set using a delay control signal (32).

17. Circuit arrangement according to claim 12, characterized in that a second counter (40) is provided which, to change its counter state, has a bridging device (33, 48–51) which can be actuated by the control signal (SG), the counter (40) being able to be operated in the first mode of operation or in the second mode of operation depending on the actuation of the bridging device (33, 48–51) by the control signal (SG).

18. Circuit arrangement according to claim 13, characterized in that at least one of the counters (14, 31, 40) is in the form of a ring counter.

* * * * *